United States Patent
Weidner

(10) Patent No.: US 9,386,728 B2
(45) Date of Patent: Jul. 5, 2016

(54) SERVER AND METHOD FOR COOLING A SERVER

(75) Inventor: Wilfried Weidner, Königsbrunn (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 199 days.

(21) Appl. No.: 14/236,939

(22) PCT Filed: Jul. 19, 2012

(86) PCT No.: PCT/EP2012/064216
§ 371 (c)(1),
(2), (4) Date: Mar. 5, 2014

(87) PCT Pub. No.: WO2013/017426
PCT Pub. Date: Feb. 7, 2013

(65) Prior Publication Data
US 2014/0233177 A1    Aug. 21, 2014

(30) Foreign Application Priority Data
Aug. 4, 2011    (DE) .......................... 10 2011 109 476

(51) Int. Cl.
*H05K 7/20* (2006.01)
*G06F 1/20* (2006.01)

(52) U.S. Cl.
CPC .............. *H05K 7/20727* (2013.01); *G06F 1/20* (2013.01); *H05K 7/20563* (2013.01); *H05K 7/20645* (2013.01); *H05K 7/20672* (2013.01); *H05K 7/20772* (2013.01); *H05K 7/20809* (2013.01)

(58) Field of Classification Search
CPC ...................... H05K 7/20627–7/20645; H05K 7/20763–7/20781; H05K 7/202

USPC ........... 361/699, 701; 165/80.4–80.5, 104.33; 174/547–548
See application file for complete search history.

(56) References Cited

U.S. PATENT DOCUMENTS

| | | | |
|---|---|---|---|
| 5,706,668 A | 1/1998 | Hilpert | |
| 7,273,088 B2 * | 9/2007 | Malone | G06F 1/20 165/104.33 |
| 7,345,873 B2 | 3/2008 | Dey et al. | |
| 7,667,967 B1 * | 2/2010 | Copeland | H05K 7/20736 165/104.33 |

(Continued)

FOREIGN PATENT DOCUMENTS

| | | |
|---|---|---|
| DE | 4445818 | 6/1995 |
| DE | 20101154 | 8/2001 |

(Continued)

OTHER PUBLICATIONS

Corresponding Notice of Reasons for Refusal of JP 2014-523275 dated Jan. 13, 2015 with English translation.

(Continued)

*Primary Examiner* — Zachary M Pape
(74) *Attorney, Agent, or Firm* — DLA Piper LLP (US)

(57) ABSTRACT

A server having a cuboid housing and having first heat-generating components arranged at a front face, system fans that generate an air flow from the front face of the server to the rear face and arranged downstream of the front face, and second heat-generating components arranged downstream of the system fans in a flow direction of the air flow, and a heat exchanger arranged upstream of the second heat generating components.

9 Claims, 2 Drawing Sheets

(56) References Cited

U.S. PATENT DOCUMENTS

| | | | |
|---|---|---|---|
| 2002/0015287 A1* | 2/2002 | Shao | H05K 7/20727 361/695 |
| 2002/0054479 A1 | 5/2002 | Wu | |
| 2005/0024824 A1 | 2/2005 | Riebel | |
| 2005/0168938 A1 | 8/2005 | Bash et al. | |
| 2005/0174733 A1 | 8/2005 | Novotny | |
| 2006/0102322 A1 | 5/2006 | Madara et al. | |
| 2007/0125523 A1* | 6/2007 | Bhatti | G06F 1/20 165/104.33 |
| 2007/0283716 A1* | 12/2007 | Marsala | G06F 1/20 62/506 |
| 2008/0198551 A1* | 8/2008 | Hoss | H01L 23/34 361/702 |

FOREIGN PATENT DOCUMENTS

| | | |
|---|---|---|
| DE | 10334798 | 3/2005 |
| DE | 102005045761 | 3/2006 |
| DE | 202007001857 | 5/2007 |
| EP | 179306 | 6/2007 |
| EP | 1793306 | 6/2007 |
| JP | 55-130339 | 9/1980 |
| JP | 57-053698 | 9/1980 |
| JP | 2004-047789 | 2/2004 |
| JP | 2005-353098 | 12/2005 |
| JP | 2006-163663 | 6/2006 |
| JP | 2008-520104 | 6/2008 |
| JP | 2011-134802 | 7/2011 |
| JP | 5471644 B2 * | 4/2014 ............. G06F 1/20 |

OTHER PUBLICATIONS

English translation of the Notice of Reason(s) for Rejection dated Jul. 14, 2015 of corresponding Japanese Application No. 2014-523275.

English summary of Japanese Notice of Reason(s) for Rejection dated Mar. 31, 2015 of corresponding Japanese Patent Application No. 2014-523275.

Notice of Allowance dated Feb. 16, 2016 from corresponding Japanese Application No. 2014-523275.

\* cited by examiner

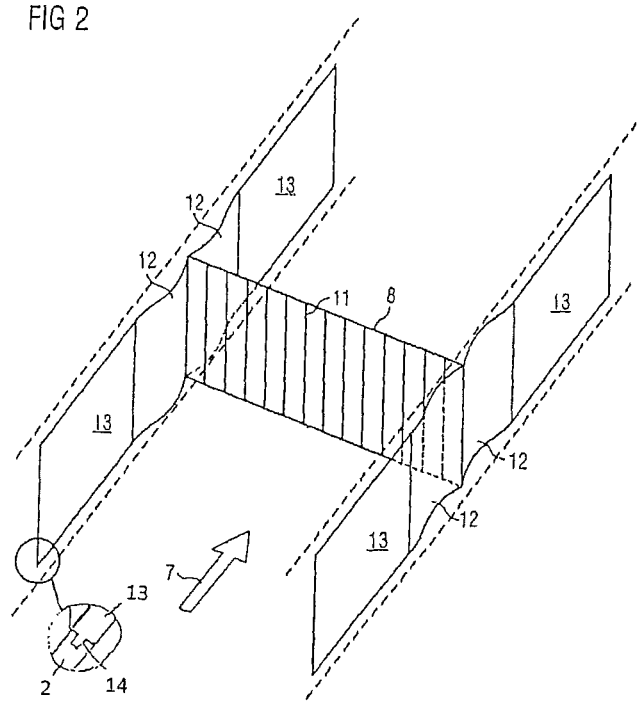

SERVER AND METHOD FOR COOLING A SERVER

TECHNICAL FIELD

This disclosure relates to a server having a cuboid housing and having first heat-generating components arranged at the front face, for example, hard drives and operable drives, wherein system fans are arranged behind, which generate an air flow from the front face of the server to the rear face and additional heat-generating components such as DC/DC converter modules of the CPU or expansion cards, for example, are arranged downstream of the system fans in the flow direction of the air flow.

BACKGROUND

Most server systems are of identical design as regards climatic construction. The hard drives and operable drives are provided at the front face, followed by a bank of fans with the system fans and, behind that the system board and possibly also the power supply.

Individual components are fitted locally with heat sinks. The CPU has a heatpipe cooler and the chipset on the system board generally has an aluminium cooler. Additional circuits or heat-generating components have possible additional cooling attachments.

Cooling is normally effected by moving air generated by the system fans. The minimum required speed of the fans is determined by those components unfavorably located with respect to the air flow or are thermally critical. These include in particular capacitors, DC/DC converter modules, PCI expansion cards and back-up batteries.

Because of these thermally critical components or elements, the system fans have to be operated at a certain speed. The higher the fan speed has to be, the greater is the noise emission of the fan and power consumption required by the fans.

It is desirable, however, for the servers to be quieter and consume less power.

It could therefore be helpful to reduce the minimum fan speed required or in the best case to enable the fan to be switched off completely.

SUMMARY

I provide a server having a cuboid housing and having first heat-generating components arranged at a front face, system fans that generate an air flow from the front face of the server to the rear face and arranged downstream of the front face, and second heat-generating components arranged downstream of the system fans in a flow direction of the air flow, and a heat exchanger arranged upstream of the second heat generating components.

I also provide a method of cooling a server comprising system fans arranged in the server that generate a cooling air flow through the server comprising after being heated by the heat-generating components, removing heat from the cooling air flow flowing through the server with a heat exchanger before the cooling air cools second heat-generating components in the server.

BRIEF DESCRIPTION OF THE DRAWINGS

FIG. 2 is an oblique schematic view of the heat exchanger with the cooling elements.

LIST OF REFERENCE NUMERALS

Figure 1:
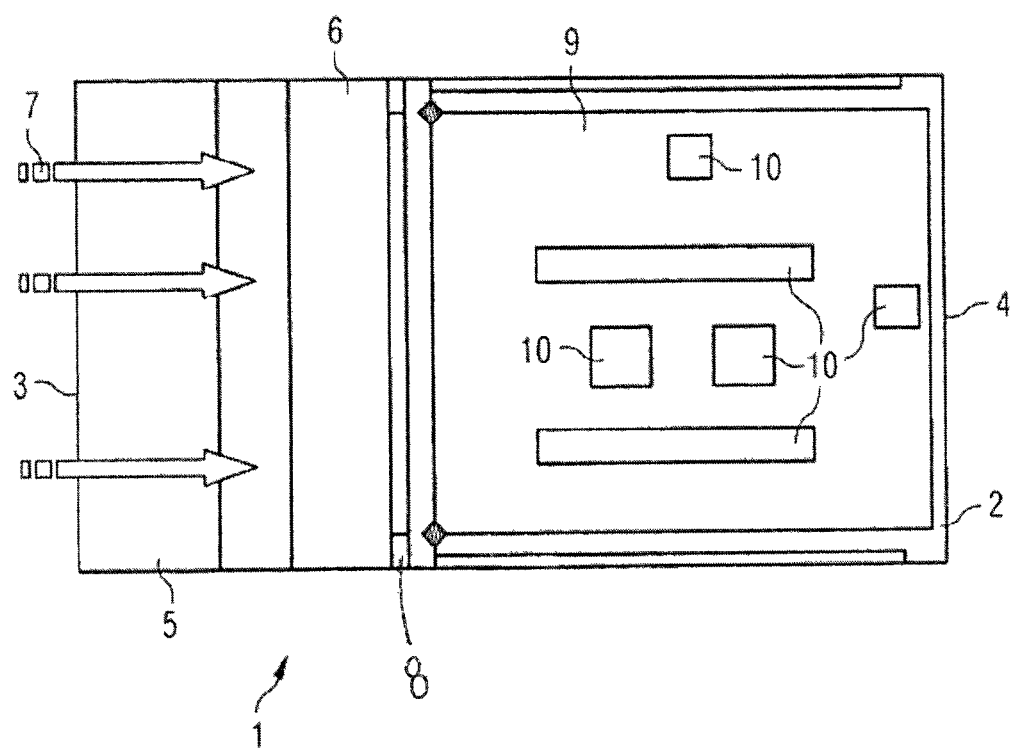
FIG. 1 is a schematic view of a server from above without a housing cover.

1 Server
2 Housing
3 Front face
4 Rear face
5 First heat-generating components
6 System fans
7 Air flow
8 Heat exchanger
9 System board
10 Additional heat-generating components
11 Fins
12 Transport medium
13 Cooling element

DETAILED DESCRIPTION

I arrange a heat exchanger upstream of the additional heat-generating components.

The hot air which has already been heated by the first heat-generating components such as the hard drives or operable drives, for example, have the greatest possible amount of heat removed therefrom by the heat exchanger before it is blown into the electronics of the server located towards the rear.

The advantage of this pre-cooling is that the pre-cooled air flows onto all electronic components in the vicinity downstream of the heat exchanger. This improves the general service life of these components, reduces the heat sink requirements, for example, for the heat sinks of the CPU and the chipset. This can involve the number of heat sinks, the size of the heat sinks or even the material of the heat sinks. Moreover, the pre-cooling significantly reduces the speed of the system fans, resulting in a reduction in noise emission and the entire system becoming quieter, which is especially important when operating a server in an office environment.

With a reduced number of fans, power consumption also decreases. Furthermore, air guides can be dispensed with or simplified, thus saving additional expense.

Preferably, the heat exchanger is planar and configured over the largest possible width and height of the housing. As a result of this design, the pre-cooling and, hence, the heat exchanger become highly efficient.

For that purpose, the heat exchanger is preferably designed as a lattice-shaped grid with cooling fins. Similar to the fins of the heat sinks, the cooling fins allow the air to flow though the heat exchanger and provide a large surface to absorb heat.

The heat exchanger is preferably coupled to the housing of the server in a heat-conducting manner and dissipates the heat to the outside via the housing.

The housing of the server is normally made of metal and there are large areas in the lateral walls and in the base plate that are available to emit heat to the ambient air. Optimum heat dissipation from the server housing to the surroundings is achieved by the large-area coupling, thus ensuring good efficiency of the heat exchanger.

Further preferably, the heat exchanger connects to a cooling element by a heat-transport medium. The heat-transport medium is preferably a gas, a liquid or a heat pipe or a heat-conducting metal or a foil, preferably of graphite.

The cooling element is preferably connected to the housing in a heat-conducting manner upstream of, behind or on both sides of the system fan, wherein the connection can be of fixed or detachable configuration.

The cooling element is preferably designed such that the connection with the housing is of large-area configuration so that optimum heat dissipation to the housing can be achieved. The cooling element can consist of copper, aluminium or graphite.

If the cooling element is detachably connected to the housing, it is advantageous if the connection engages positively, for example, by a dovetail joint so that an easy assembly can be effected. To increase the heat transfer, preferably a heat-conducting paste or heat-conducting oils can be used in the positive-fit joint.

Cooling is further preferably increased by shaping the housing such that heat dissipation is improved. For that purpose, ribs can be embossed in the housing, providing a larger surface area than a smooth housing.

I also provide a method of cooling a server with system fans arranged in the server. The fans generate a cooling air flow through the server, wherein, after being heated by first heat-generating components, the cooling air flowing through the server has heat removed therefrom by a heat exchanger before the cooling air cools additional heat-generating components in the server.

By cooling the air that has been warmed by the first heat-generating components, a more efficient cooling of the additional heat-generating components is achieved, with the result that the fan speed and, hence, also the power consumption can be significantly reduced.

Further advantages of my devices and methods are disclosed in the following description of the figures. My devices and methods are explained in greater detail hereafter by means of an example illustrated in the drawings.

FIG. 1 shows schematically from above a server 1, the cover of the server having been removed so that the inner workings can be seen schematically. The server comprises a substantially cuboid housing 2 which is generally installed in a server rack via telescopic rails. The server may, however, be configured as a floor-standing server which is set up similarly to a tower PC in space.

The housing 2 comprises a front face 3 and a rear face 4. First heat-generating components 5 such as the hard drives and operable drives, for example, are arranged at the front face 3.

A block of system fans 6 is arranged downstream of these first heat-generating components 5, the fans generating an air flow 7 from the front face to the rear face of the server 1. A heat exchanger 8 is provided downstream of the system fans 6 and extracts heat again from the air flow 7 already pre-warmed by the first heat-generating components 5. A system board 9 is provided downstream of the heat exchanger 8 in the rear part of the server 1, additional heat-generating components 10 such as, for example, a CPU, chipset, memory modules, capacitors, DC/DC converter modules, expansion cards 10, being provided on the system board 9.

These additional heat-generating components 10 represent what are known as "hot spots", and determine the minimum speed of the system fans 6. To reduce the fan speed or to switch off operation thereof completely, the heat exchanger 8 extracts heat from the pre-warmed air so that pre-cooled air flows around these additional heat-generating components 10 and the system board 9 as well, thereby achieving more efficient cooling.

FIG. 2 shows in a schematic view an example of a heat exchanger 8. The heat exchanger 8 is designed as grid-shaped grating, like a radiator for a vehicle engine, with a facility for collecting and transferring heat. Air is extracted by fins 11 and delivered to a transport medium 12 and passed on. Transport media 12 can be, for example, suitable gases, suitable liquids, heat pipe technology, heat-conducting metals, foils, preferably made of graphite. The transport medium 12 connects to a cooling element 13 which is of large-area configuration and connected in a heat-conducting manner to the housing 2 of the server so that heat can be delivered via the cooling element 13 to the housing 2 of the server 1. The cooling elements 13 may, as illustrated in FIG. 2, be constructed on the lateral walls in front of and behind the heat exchanger 8 and also on the bottom walls. Mounting the cooling element 13 on the cover wall of the housing 2 of the server 1 is also possible, but more complicated, since the cover of the server is generally designed to be removable.

The cooling element can be detachably or rigidly coupled to the housing 2. It is important that the connection between cooling element 13 and housing 2 has a large area to achieve an ideal heat transfer and enable the housing 2 of the server 1 to deliver the heat to the ambient air over a large area.

Normally, the housings 2 of servers consist of sheet metal, metals such as copper or aluminium or even graphite being especially suitable as heat exchangers in the sheet metal for the cooling element 13. The housing 2 is advantageously shaped such that the surfaces emit heat to the surroundings in the most favorable manner possible.

With a positive-fit connection/detachable coupling 14 of the cooling element 13 to the housing 2, the positive-fit connection/detachable coupling 14 can comprise two metal parts shaped according to the tongue and groove principle or are in the form of a sliding dovetail joint. Other positive-fit connections are also possible, however. To increase the heat transfer, use can be made of lubricants such as, for example, heat-conducting pastes or special heat-conducting oils. If the positive-fit connection/detachable coupling 14 is optimal, these additional agents such as heat-conducting pastes or special oils may even be dispensed with.

As a result of the invention, the rear region of the fan too is cooled not with pre-heated air, but with air pre-cooled by the heat exchanger which leads to considerably more efficient cooling of the additional heat-generating components 10. The additional heat-generating components 10 are often very critical components which lead to a high speed of the system fans or to costly cooling measures such as additional heat sinks, fans or air circulating hoods.

The invention claimed is:

1. A server having a cuboid housing and having first heat-generating components arranged at a front face, system fans that generate an air flow from the front face of the server to a rear face and arranged downstream of the front face, and second heat-generating components arranged downstream of the system fans in a flow direction of the air flow, and a heat exchanger arranged upstream of the second heat generating components;
   wherein the heat exchanger is a grid shaped grating with cooling fins;
   the heat exchanger connects to cooling elements via a transport medium; and
   the cooling elements connect to lateral walls of the housing in a heat-conducting manner on both sides of the system fans such that the air flow can pass through the grid-shaped grating of the heat exchanger between the cooling elements for pre-cooling heated air by the first components.

2. The server according to claim 1, wherein the heat exchanger is planar and configured over a maximum possible width and height of the housing.

3. The server according to claim 1, wherein the transport medium is a gas, a liquid, a heat pipe, a heat-conducting metal, a foil, or graphite foil.

4. The server according to claim 1, wherein connection of the cooling element to the housing is detachable.

5. The server according to claim 1, wherein the cooling element comprises copper, aluminum or graphite.

6. The server according to claim 1, wherein the housing is shaped to facilitate heat emission.

7. The server according to claim 1, wherein the first heat generating components are at least one of hard drives or operable drives.

8. The server according to claim 1, wherein the second heat-generating components are at least one of capacitors, DC/DC converters, components of CPU or expansion cards.

9. A server having a cuboid housing and having first heat-generating components arranged at a front face, system fans that generate an air flow from the front face of the server to a rear face and arranged downstream of the front face, and second heat-generating components arranged downstream of the system fans in a flow direction of the air flow, and a heat exchanger arranged upstream of the second heat generating components;
- wherein the heat exchanger is a grid shaped grating with cooling fins;
- the heat exchanger connects to cooling elements via a transport medium; and
- the cooling elements connect to lateral walls of the housing in a heat-conducting manner on both sides of the system fans such that the air flow can pass through the grid-shaped grating of the heat exchanger between the cooling elements for pre-cooling heated air by the first components;
- connection of the cooling element to the housing is detachable; and
- the detachable connection between the cooling element and the housing is a positive-fit connection.

* * * * *